United States Patent Office 3,687,718

Patented Aug. 29, 1972

3,687,718
SILICA SURFACE TREATMENT

Richard J. Morrison, Northborough, and Sidney D. Ross, Williamstown, Mass., assignors to Sprague Electric Company, North Adams, Mass.

No Drawing. Filed Nov. 28, 1969, Ser. No. 880,963
Int. Cl. H05k *1/00*
U.S. Cl. 117—106 A 4 Claims

ABSTRACT OF THE DISCLOSURE

The method concerns the preparation of a silica surface of an electrical device for receipt of an adherent photoresist coating. It involves subjecting the device to a temperature and for a time sufficient to remove from the silica surface all adsorbed $H_2O$. Thereafter, the surface is contacted with an organochlorosilane in the vapor state.

BACKGROUND OF THE INVENTION

This invention is concerned with a process for preparing a silica surface for receipt of an adherent photoresist coating and more particularly for so preparing the silica surface of an electrical device.

Among the various processing steps leading to the manufacture of monolithic silicon circuits, the most costly operations are those involving the plurality of photoresist operations. For this reason alone it is imperative that the photoresist operations be as free from problems as possible. The photoresist operations, of which there may be 10 or 12 in a typical manufacturing process, includes the application of certain commercial photo-polymer coatings to a silica surface. The terms photo-polymer coatings or photoresists are generic terms for classes of photosensitive materials which when applied as thin coatings on chemically attackable substrates will provide a chemically resistant coating in the light-struck regions. In the preparation of silicon based devices dimensions are in the submicron range and therefore deviations from desired dimensions at least must be considerably less than fractions of a micron.

It has been determined that on a silica surface, in addition to what are known as silanol groups (SiOH), there are always associated a certain proportion of adsorbed $H_2O$. When any of the commercial photoresists are applied to a silica surface having adsorbed water thereon, the bond between the photoresist and the silica surface is comparatively poor. When such is the case, during etching to remove the oxide layer from the unprotected portion of the surface, instead of obtaining an access hole that has sides almost perpendicular to the silicon substrate surface, there is obtained etched holes showing considerable taper or rounding at the upper edge. Since it is known that the etchant will not attack the photoresist, the cause of the defect is considered to be the poor adhesion between the photo-polymer and the silica surface.

It would be considered a significant advance in the art if a technique could be presented which would insure the maximum possible adhesion between the photoresist and the silica surface.

It is therefore an object of the present invention to present an improved technique for preparing the silica surface of a silicon based device for receipt of an adherent coating of a photoresist layer.

Other objects and advantages of the present invention will become apparent to those skilled in the art as the description proceeds.

SUMMARY OF THE INVENTION

The present invention involves a method of preparing a silica surface of an electrical device for receipt of an adherent photoresist coating. The method involves: (a) subjecting the device to a temperature between about 200–500° C. for a time sufficient to remove from the silica surface at least substantially all adsorbed $H_2O$ and (b) while maintaining said temperature, contacting the surface with an organochlorosilane in a vapor state.

In a preferred aspect of the invention the organochlorosilane is carried by an inert gas diluent. A preferred silane is dimethyldichlorosilane.

DETAILED DESCRIPTION OF THE INVENTION

Example

A 0.5 micron thick layer of silica was grown on a series of eighteen, 1½ inch diameter silicon wafers. These units were exposed to ambient temperature (25° C.) and humidity (relative humidity about 70%) for a period of about 24 hours. These conditions are known to cause appreciable adsorption of $H_2O$ on the surface of the silica.

A first group of six of the units, without first being subjected to a furnace drying step, were immersed in a 1% solution of dimethyldichlorosilane in trichloroethylene and heated in air at 250° C. for about 30 minutes.

A second group of six of the units were heated in a furnace at 350° C. for about 15 minutes while dry (less than 2 p.p.m./$H_2O$) nitrogen was flushed over the units at a rate of about 1800 cc./minute. The units were removed from the furnace and cooled enough to permit immersion in a 1% solution of dimethyldichlorosilane in trichloroethylene. They were then removed and heated in air at 250° C. for about 30 minutes.

The third group of six units were heated in a furnace at 350° C. for about 15 minutes while dry nitrogen was flushed over their surfaces at a rate of 1800 cc./minute. While maintaining this temperature, dry nitrogen, at the rate of 25 cc./minute, was passed through a dimethyldichlorosilane bubbler and the nitrogen-entrained-silane stream brought into contact with the silica surfaces for a period of about 15 minutes.

The treated surfaces of all the units were coated with a 1.0 micron layer of a commercial photoresist, known as Kodak Thin Film Resist (KTFR). This resist comprises mainly a cinnamic acid ester of poly(vinyl alcohol) containing a sensitizer. Employing conventional techniques and a test pattern mask, the pattern was exposed and etched onto the silica surfaces.

If there is excellent adhesion between the photoresist and the treated silica surface, the etch factor of oxide should approach 1. The etch factor is defined as the measured lateral etching divided by the measured depth of etching.

To determine the degree of undercutting, or the absence thereof, in the above-defined units, measurements were made at 600 times magnification with a calibrated filar eyepiece. Measurements were made on a ten micron image at the base thereof and on the etched edge.

Measurements of the first and second groups of six units revealed increases of from 20–40% at the upper edge of the opening as compared with the corresponding mask dimension, while the base of the opening increased from 1–2%. This indicates severe undercutting due to poor adhesion of the photoresist to the silica.

Measurements of the third group revealed that the etch factor was substantially 1 with both the upper edges and base increasing only from 1–2% as compared with the mask dimensions. This indicates no measurable undercutting in the region of the photoresist.

While the specific example has shown the introduction of the dimethylidichlorosilane entrained in a dry nitrogen diluent, it is to be understood that by careful control of conditions the silane can be introduced alone as a vapor. Also, while dimethyldichlorosilane was employed in the specific example, it is to be understood that other organochlorosilanes, such as methyltrichlorosilane, trimethylchlorosilane, etc. may be employed. Acetoxy- and aminosilanes may also be employed. In addition to the KTFR photoresist, other commercial photoresists, such as Kodak Photo Resist, type 2 (KPR-2), Kodak Metal Etch Resist (KMER), etc. may also be employed. As indicated above the process of the present invention can be carried out at any temperature between 200–500° C. In place of nitrogen, other inert diluent gases, e.g. argon, etc. may be employed. It is imperative that after removal of adsorbed $H_2O$ from the silica surface, conditions be maintained to prevent re-exposure to a $H_2O$-containing atmosphere.

While the invention has been particularly shown and described with reference to a preferred embodiment thereof, it will be understood by those skilled in the art that various changes in form and details may be made therein without departing from the spirit and scope of the invention.

What is claimed is:

1. The method of preparing a silica surface of an electrical device for receipt of an adherent photoresist coating comprising the steps of:
   (a) subjecting said silica surface to a temperature between about 200–500° C. in a furnace while flushing said surface with an inert gas for a time sufficient to remove from said surface at least substantially all adsorbed water; and
   (b) while maintaining said temperature in said furnace and preventing exposure to a water-containing atmosphere, contacting said surface with an organochlorosilane in a vapor state carried by a continued flow of said inert gas.

2. The method of claim 1 wherein said inert gas is dry nitrogen.

3. The method of claim 2 wherein said organochlorosilane is dimethyldichlorosilane.

4. The method of claim 1 wherein said organochlorosilane is dimethyldichlorosilane.

References Cited

UNITED STATES PATENTS

| | | | |
|---|---|---|---|
| 2,470,593 | 5/1949 | Webb et al. | 117—106 X |
| 3,089,793 | 5/1963 | Jordan et al. | 117—106 X |
| 2,845,364 | 7/1958 | Waggoner | 117—54 X |
| 3,157,534 | 11/1964 | Domicone et al. | 117—54 X |

RALPH S. KENDALL, Primary Examiner

U.S. Cl. X.R.

96—36.2; 117—212, 213; 156—17